(12) United States Patent
Spencer et al.

(10) Patent No.: US 9,888,594 B1
(45) Date of Patent: Feb. 6, 2018

(54) DEVICES INCLUDING A CAVITY REGION TO HOUSE PORTS

(71) Applicant: HEWLETT PACKARD ENTERPRISE DEVELOPMENT LP, Houston, TX (US)

(72) Inventors: Stephen Spencer, Houston, TX (US); Keith J Kuehn, Magnolia, TX (US); Paul Nicholas Greff, Houston, TX (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days.

(21) Appl. No.: 15/283,240

(22) Filed: Sep. 30, 2016

(51) Int. Cl.
*H05K 5/00* (2006.01)
*H05K 5/02* (2006.01)

(52) U.S. Cl.
CPC ......... *H05K 5/0204* (2013.01); *H05K 5/0017* (2013.01); *H05K 5/0226* (2013.01); *H05K 5/0247* (2013.01)

(58) Field of Classification Search
CPC combination set(s) only.
See application file for complete search history.

(56) References Cited

U.S. PATENT DOCUMENTS

| | | | | |
|---|---|---|---|---|
| 5,450,221 | A * | 9/1995 | Owen | G01D 11/24 174/50 |
| 6,310,767 | B1 * | 10/2001 | Spear | G02F 1/133308 248/917 |
| 6,532,152 | B1 | 3/2003 | White et al. | |
| 6,702,604 | B1 * | 3/2004 | Moscovitch | B60R 11/0235 248/121 |
| 6,956,735 | B2 | 10/2005 | Lee et al. | |
| 7,145,767 | B2 * | 12/2006 | Mache | F16M 11/046 361/679.21 |
| 7,201,356 | B2 * | 4/2007 | Huang | F16M 13/02 248/27.3 |
| 7,929,287 | B2 * | 4/2011 | Yukawa | G06F 1/1605 313/582 |
| 8,031,463 | B2 * | 10/2011 | Yukawa | G06F 1/1615 313/582 |
| 8,125,771 | B2 * | 2/2012 | Yukawa | G06F 1/16 313/582 |
| 8,199,507 | B2 | 6/2012 | Shohet et al. | |
| 8,279,593 | B2 * | 10/2012 | Zheng | G06F 1/1601 211/26 |
| 8,537,122 | B2 * | 9/2013 | Geiger | G06F 1/1607 345/173 |
| 8,537,532 | B2 * | 9/2013 | Chen | G06F 1/1601 248/917 |
| 2007/0097617 | A1 * | 5/2007 | Searby | F16M 11/041 361/679.4 |
| 2007/0097618 | A1 * | 5/2007 | Searby | F16M 11/041 361/679.4 |
| 2007/0182663 | A1 | 8/2007 | Biech | |
| 2009/0225504 | A1 * | 9/2009 | Wu | F16M 11/2021 361/679.21 |

(Continued)

*Primary Examiner* — Lisa Lea Edmonds
(74) *Attorney, Agent, or Firm* — Hewlett Packard Enterprise Patent Department

(57) ABSTRACT

Devices including a cavity region to house a plurality of ports are described. In one example, a device includes a first side including a display region, a second side including a cavity region to house a port, and a third side including a cutout region adjacent to the cavity region.

18 Claims, 8 Drawing Sheets

(56) References Cited

U.S. PATENT DOCUMENTS

| | | | |
|---|---|---|---|
| 2011/0054268 A1* | 3/2011 | Fidacaro | A61B 5/0002 600/300 |
| 2011/0063789 A1* | 3/2011 | Ma | G06F 1/1601 361/679.21 |
| 2012/0147533 A1 | 6/2012 | Wang et al. | |
| 2012/0155004 A1* | 6/2012 | Yukawa | G06F 1/1601 361/679.21 |
| 2014/0153176 A1* | 6/2014 | Ashcraft | G06F 1/166 361/679.21 |
| 2014/0160656 A1* | 6/2014 | Morrison | G06F 1/1626 361/679.21 |
| 2015/0085439 A1* | 3/2015 | Lee | H05K 7/1481 361/679.21 |
| 2016/0062399 A1* | 3/2016 | Hsu | G06F 1/1601 361/679.21 |

* cited by examiner

DEVICES INCLUDING A CAVITY REGION TO HOUSE PORTS

BACKGROUND

Data centers are facilities used to house computer systems and associated components such as telecommunications and storage systems. The computer systems (e.g., servers, routers, switches) and associated components can be organized in racks or cabinets. A data center administrator may need to monitor all aspects of the systems and components onsite or from a remote location.

BRIEF DESCRIPTION OF THE DRAWINGS

Some examples of the present application are described with respect to the following figures.

DETAILED DESCRIPTION

The described examples provide a computing device that connects to a data center to monitor computing systems and associated components. The device can monitor all aspects of products installed in the data center from an onsite location or from a remote location. The device can function and be operated in an office environment (e.g., on a desk of a data center administrator) or at the data center. The device is configured to be placed in a vertical orientation or a horizontal orientation on a desktop. In a desktop environment, for example, the device can stand alone or lay flat on the desktop, or the device can be removably attached to a stand for desktop or top of rack placement. In the data center environment, for example, the device can be mounted on the rack while still providing access to information related to the products being monitored. For example, the device can be mounted on top of the rack via the stand, attached to the front of the rack via a hinge (or attachment members), or mounted to a door of the rack via a mounting bracket.

In both the desktop environment and the data center environment, the device provides access to information related to the products being monitored by providing communication, power, data, and storage ports, while maintaining a clean look in any orientation a user places the device. For example, a front surface of the device provides a display region including a capacitive touchscreen to display data (e.g., information icons and control icons). Further, a back surface of the device includes a cavity region to house the ports and to receive a removable attachable bracket to mount the device to the rack. The back surface of the device also includes a cutout region to removably attach the device to the stand and to route cable from the cavity region out of the device. Accordingly, the device is usable in an onsite or offsite location to monitor a plurality of products.

In one example, a device includes a first side including a display region, a second side including a cavity region to house a port, and a third side including a cutout region adjacent to the cavity region.

In another example, a system includes a device including a front side and a back side. The front side includes a display area. The back side includes a cavity region to house a plurality of ports, and a cutout portion at an edge of the back side. The system also includes a stand. The stand includes a top portion including a hinge to removably attach to the device, and a base portion including a cutout region to egress cable from the device.

Figure 1:
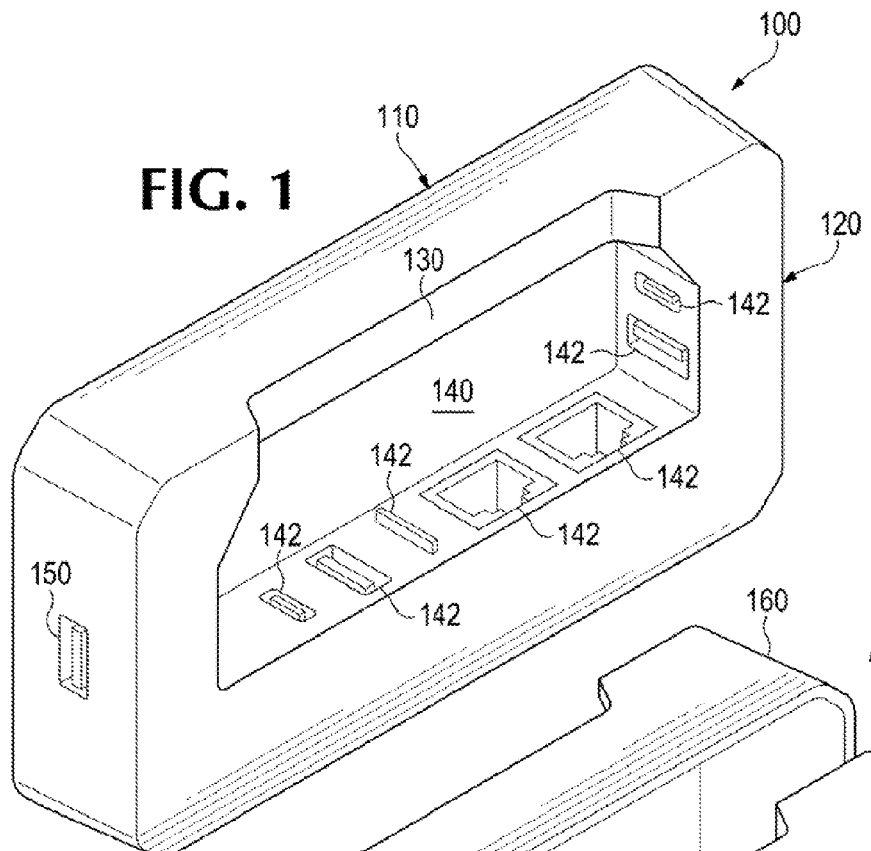
FIG. 1 is an isometric view of a device including a cavity region on a back side to house a plurality of ports, according to an example.

Referring now to the figures, FIG. 1 is an isometric view of a device including a cavity region on a back side to house a plurality of ports, according to an example. Device 100 can be a portable computing device with wired and/or wireless network communication access to computing systems and components such as server devices, networking devices, storage devices, switches, etc. that may reside in a data center (e.g., rack mount devices). Device 100 can be configured to monitor all aspects of the systems and components. For example, device 100 can monitor health and connectivity status of the systems and components. It should be noted that device 100 can be configured to monitor any aspect of the systems and components by a user (e.g., an administrator).

Device 100 includes a front side 110 and a back side 120 opposite the front side 110. The front side 110 includes a display region (not shown). The back side 120 includes a cavity region 140 and a cutout portion 130. Cavity region 140 can house a plurality of ports 142. Ports 142 can include communication ports, data ports, storage ports, and power ports. For example, ports 142 can include universal serial bus (USB) ports for USB drives or for power connectivity, registered jack 45 (RJ45) ports for data and/or communication, secure digital (SD) memory card for storage (e.g., miniSD, microSD, etc.). Cavity region 140 can house as many or as few of each type of port 142 as needed for providing power, communication, and storage for the device 100. Further, the ports 142 can be oriented in any direction (e.g., vertical or horizontal), relative to the device 100. It should be noted that, as used herein, a port can include or refer to a connector. Thus, ports and connectors can be used interchangeably. It should be noted that other types of ports/connectors 142 are anticipated and may be provided for the device 100 depending on use case and needs (e.g., HDMI for audio/video, display port, etc.). Cavity region 140 can also receive a removable bracket (not shown), usable to mount the device to a rack. This feature is described in greater details with respect to FIGS. 11 and 12.

Figure 4:
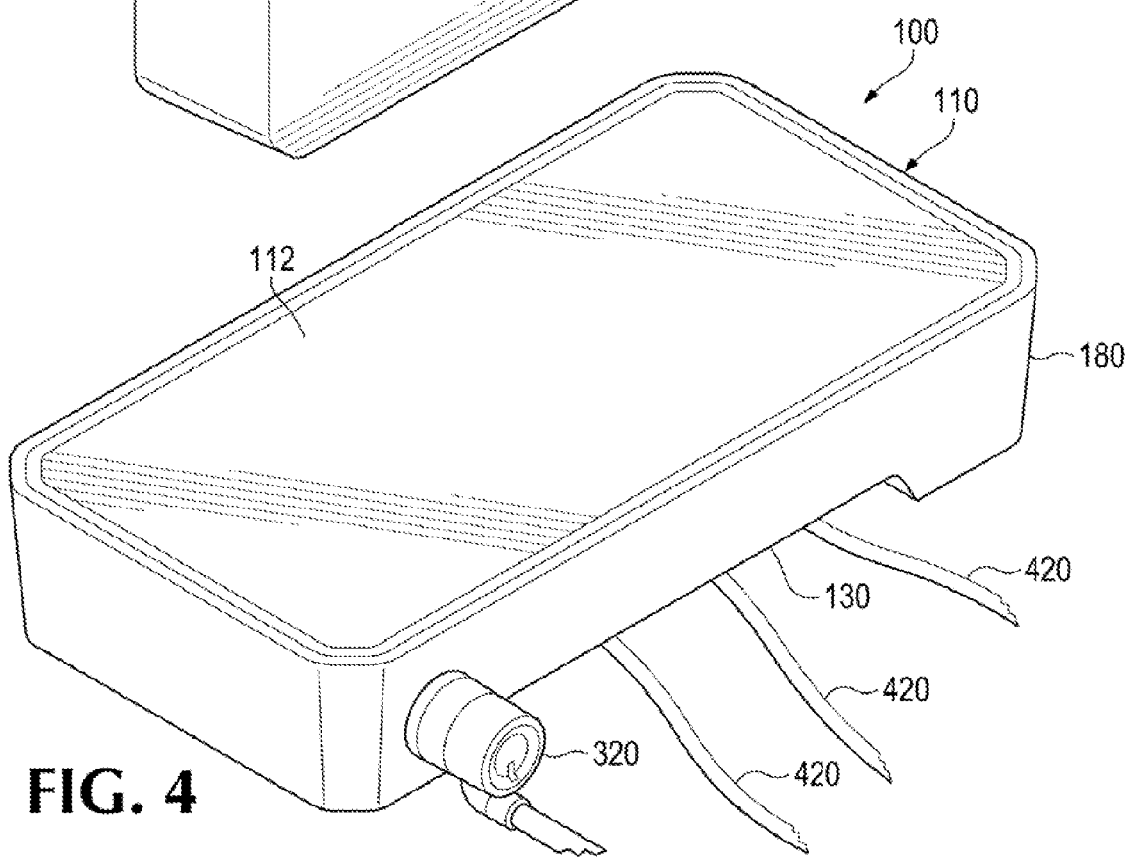
FIG. 4 is an isometric view of the device in a horizontal orientation with cables exiting the device via a cutout region, according to an example.

Cutout portion 130 of the back side 120 of the device 100 is to route cable from the cavity region 140 out of the device 100. For example, when the device 100 is laid flat horizontally on a surface (i.e., with the front side 110 facing upward, cables connected to the ports 142 can be routed (i.e., egress) out of the device 100 to preserve a clean front surface as shown in FIG. 4. Cutout portion 130 can also function to removably attach the device to a stand (not shown) via a hinge. When attached to the stand, device 100 can rotate about the hinge. For example, device 100 can be tilted up or down about the hinge to enable a user view the display region. In certain examples, cutout portion 130 can be adjacent to the cavity region 140. Thus, cutout portion 130 can be at an edge of the back side 120 of the device 100. In some examples, the hinge can be included within the cutout portion 130 to removably attach the device 100 to the stand or to mount the device 100 in a rack.

Device 100 can also include sidewalls around a perimeter of the device 100. Sidewalls can be defined by the regions in between the front side 110 and the back side 120. As an example, device 100 may include four (4) sidewalls (e.g., a left sidewall, a right sidewall, a top sidewall, and a bottom sidewall). In certain examples, the cutout portion 130 is located at the top sidewall of the device 100. In other examples, at least one sidewall (e.g., the left sidewall or the right sidewall) of the device 100 includes a port 150. In some examples, port 150 located on a sidewall can be used to provide firmware updates to the device 100.

Figure 2:
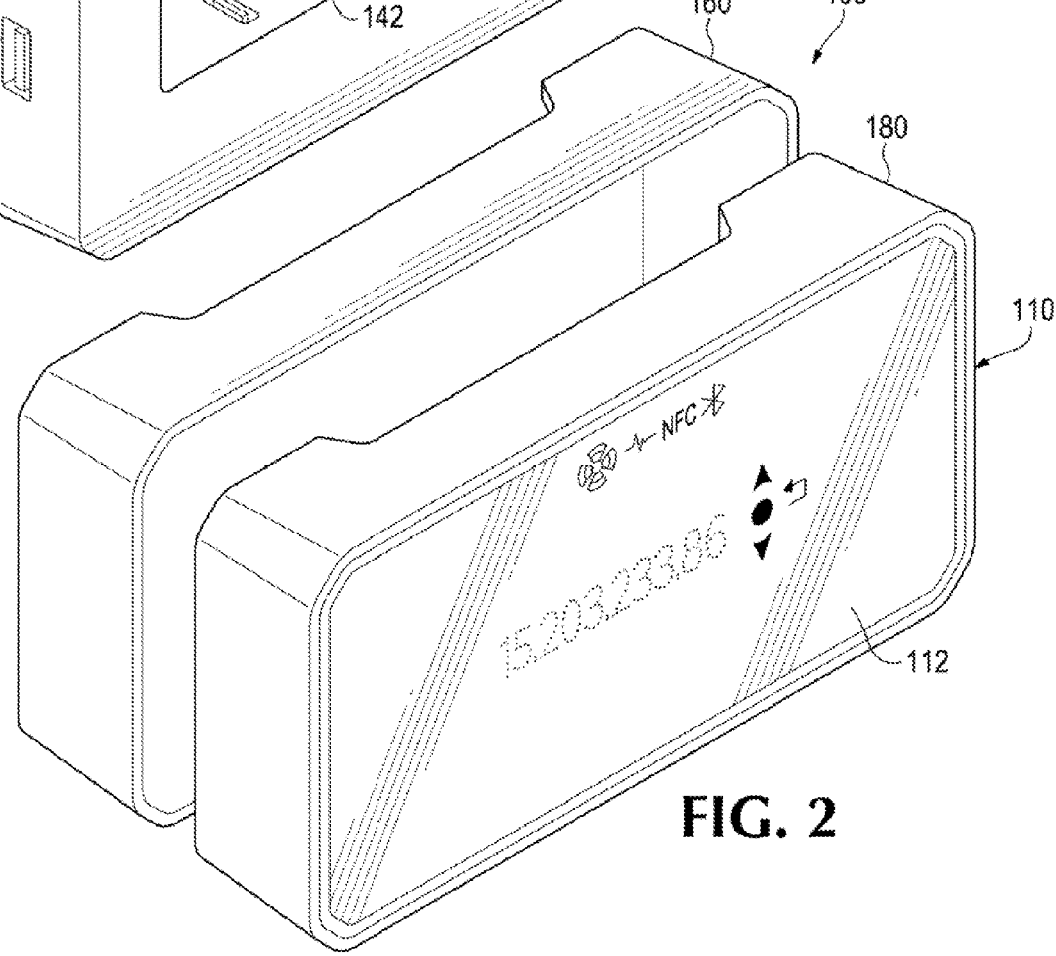
FIG. 2 is an isometric view of a front side of the device including an outer shell, according to an example.

FIG. 2 is an isometric view of a front side of the device including an outer shell, according to an example. Front side 110 includes a display region 112. Display region 112 can include a capacitive touchscreen to display data. The capacitive touchscreen can be an interactive touchscreen to receive user input and display data output to the user. In some examples, the data displayed can include information icons and control icons. For example, the information icons can include connectivity status and type (e.g., Bluetooth, NFC, Wi-Fi, etc.), unique identification number (UID), internet protocol (IP) address, system health, etc. Control icons can include, for example, a scroll icon, a return (or back) icon, a selection icon, etc.

In some examples, the information and control icons can be dead fronted with light pipes behind each icon (i.e., light pipes placed behind each icon) to enable the icons to be displayed. In yet other examples, the device 100 can operate in a number of modes including a power saving mode which can be activated after a threshold period of inactivity of the device 100 (e.g., a few seconds or minutes). In the power saving mode, the icons can be replaced with a customized graphic display such as a company logo. In such examples, the customized display function as a "screen saver" for the device 100 in the power saving mode.

In certain examples, device 100 can be fitted with a removable case 160 for enclosing the sidewalls (i.e., the perimeter) 180 of the device 100. The removable case 160 can be mode from injection molded plastic. Further, the removable case 160 can be customized to any desirable color for a user's needs (e.g., representing the colors and/or logos of a particular customer). In some examples, the front side 110 can include a trim ring around the front side 110, where the trim ring can be made of a metallic material.

Figure 3:
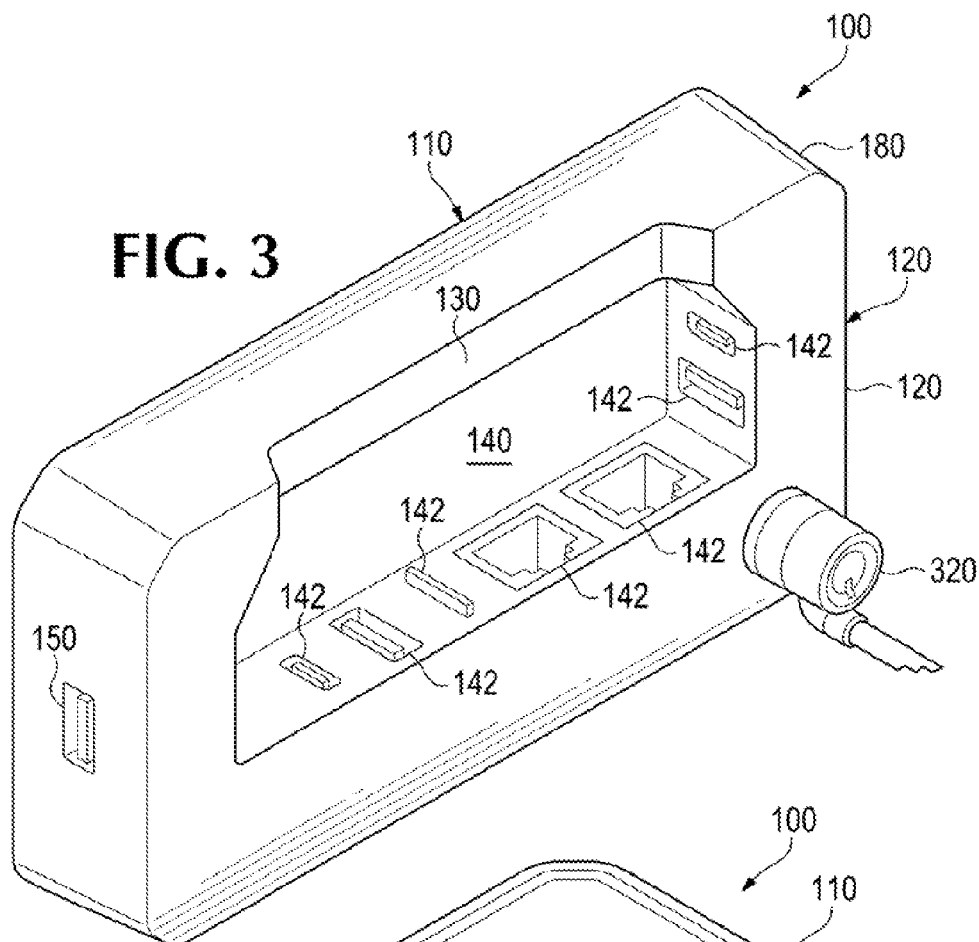
FIG. 3 is an isometric view of the device including a security lock on the back side, according to an example.

FIG. 3 is an isometric view of the device including a security lock on the back side, according to an example. In the example of FIG. 3, a security lock 320 is removably attached to the back side 120 of the device 100. Security lock 320 can be a Kensington lock or any other type of computer security lock. The security lock 320 can be attached to a security slot (not shown) on the back side 120 of the device 100. Security lock 320 can be attached to the back side 120 of the device 100 when the device 100 is placed in a vertical position, for example.

FIG. 4 is an isometric view of the device in a horizontal orientation with cables exiting the device via a cutout region, according to an example. In the example of FIG. 4, security lock is removably attached to the sidewall 180 of the device 100. Security lock 320 can be a Kensington lock or any other type of computer security lock. The security lock 320 can be attached to a security slot (not shown) on the sidewall 180 of the device 100. Security lock 320 can be attached to the sidewall 180 of the device 100 when the device 100 is placed in a horizontal position, for example. Further, when the device 100 is placed in the horizontal position, the cutout portion 130 provides a means for routing cables 420 from the cavity region 140, out of the device 100. Thus, for example, when the device 100 is laid flat horizontally on a surface (e.g., a desktop), the cables 420 connected to the ports 142 can be routed out of the device 100.

Figure 5:
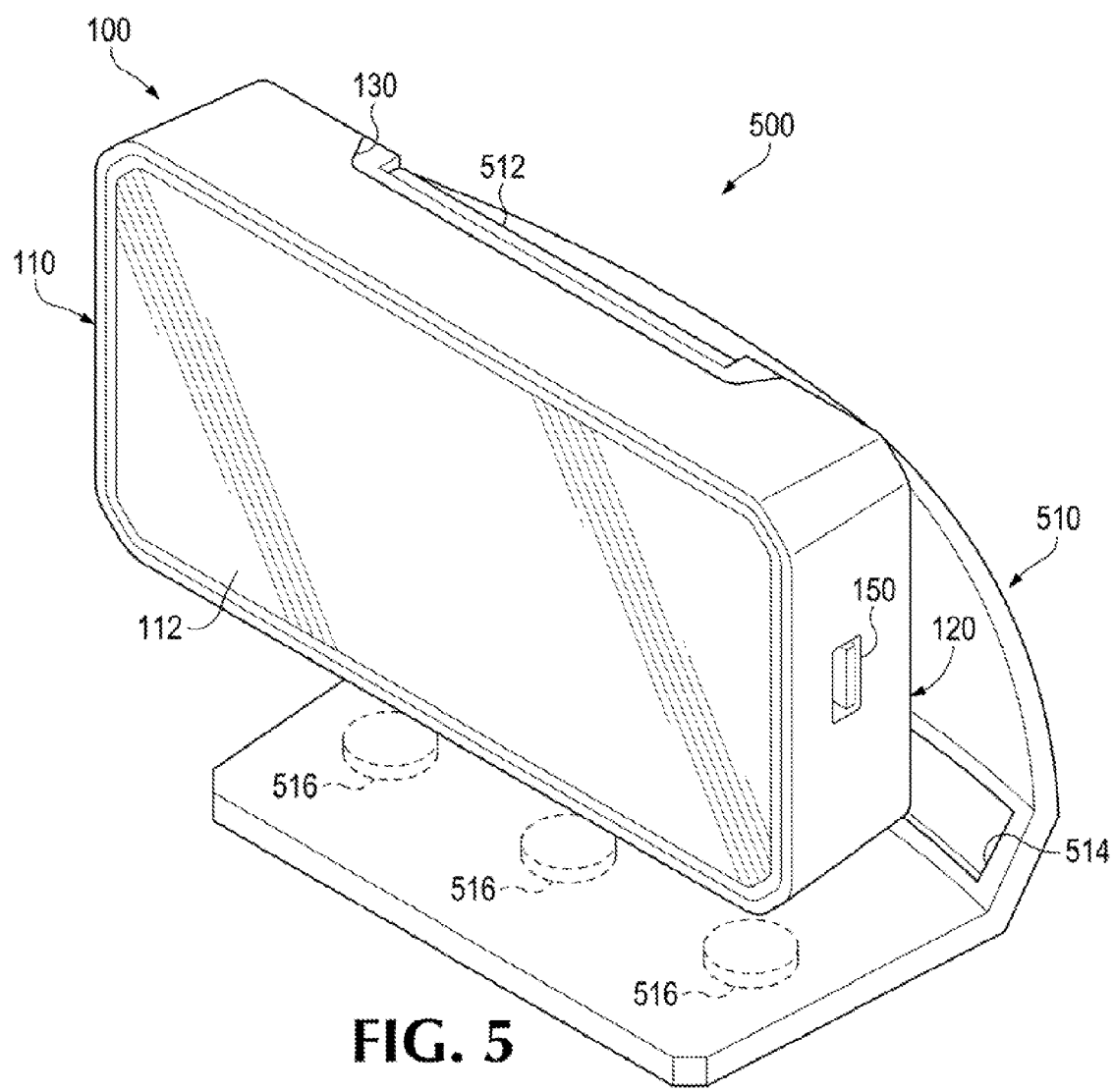
FIG. 5 is an isometric view of the device removably attached to a stand via a hinge, according to an example.

FIG. 5 is an isometric view of the device removably attached to a stand via a hinge, according to an example. System 500 includes the device 100 and a stand 510 for removably attaching the device 100 for placement on a surface (e.g., desktop or top of rack). The stand 510 includes a top portion and a base portion.

The top portion of the stand 510 includes a hinge 512 to removably attach to the device 100. Hinge 512 attaches to the device 100 at the cutout portion 130 of the device 100. Hinge 512 enables partial rotation of the device 100 about the stand 510. For example, when attached to the stand 510, device 100 can tilt up and down to view the display region 112 of the device 100. The base portion of the stand 510 includes a cutout region 514 to egress cable from the device 100. When the device 100 is attached to the stand 510, cables 420 attached to the back side 120 (i.e., connected to the ports 142 of the cavity region 140), can egress from the device 100 via the cutout region 514 of the stand 510. In some examples, cutout region 514 can be located above an area of the base portion that makes contact with a surface upon which the stand 510 is placed. In certain examples, the cutout region 514 extends almost an entire width of the base portion of the stand 510.

The base portion can also include magnetic members 516 disposed within the base portion of the stand 510. Magnetic members 516 can be used for mounting the system 500 on top of a rack, for example. Magnetic members 516 enable magnetic coupling or mechanical coupling of the stand 510 with a surface such as a top of rack surface. The surface may be a metallic surface or a surface including corresponding magnetic members to couple with the magnetic members 516 of the stand 510. The magnetic members 516 can be disposed in a portion of the base portion that makes contact with the surface upon which the stand 510 is placed.

Figure 6:
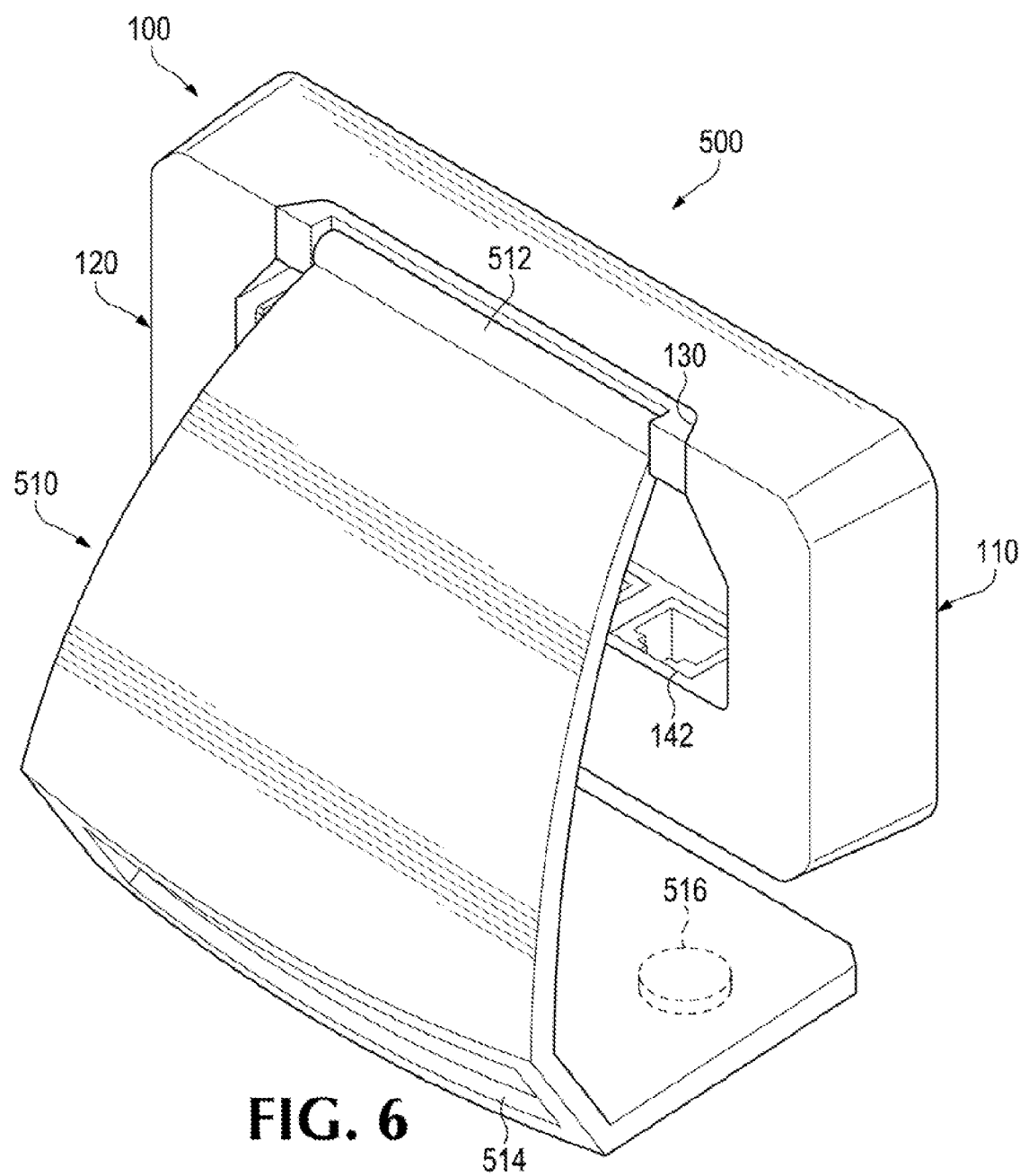
FIG. 6 is an isometric view of the device removably attached to the stand, according to another example.

FIG. 6 is an isometric view of the device removably attached to the stand, according to another example. The example of FIG. 6 shows a back/rear view of the system 500. The system 500 includes the device 100 attached to the stand 510. The stand 510 includes the hinge 512 for attaching to the device 100. In certain examples, the hinge 512 can be a part of the device 100. The stand 510 also includes a base portion with a cutout region 514 for cable egress and magnetic members 516 for placing the stand 510 on a metallic or magnetic surface such as the top of a rack.

Figure 7:
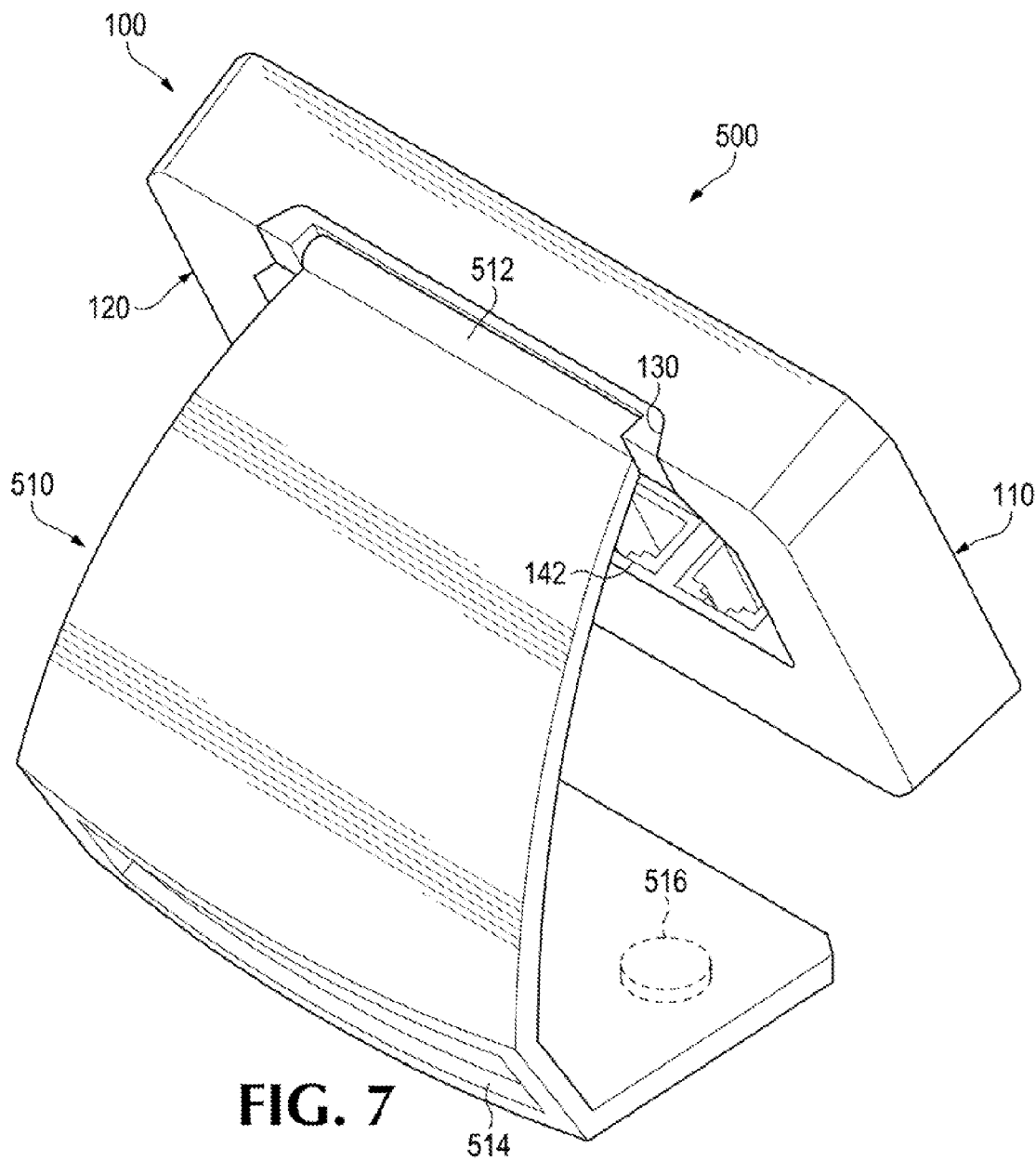
FIG. 7 is an isometric view of the device removably attached to the stand and tilted about the hinge, according to another example.

FIG. 7 is an isometric view of the device removably attached to the stand and tilted about the hinge, according to another example. In the example of FIG. 7, the device 100 is tilted upwards. Tilting of the device 100 is enabled by the hinge 512, thereby providing appropriate viewing angles for the device 100. Accordingly, the device can be tilted upwards or downwards to enable viewing of the display region 112 of the device 100 when mounted on the top of a rack, for example.

Figure 8:
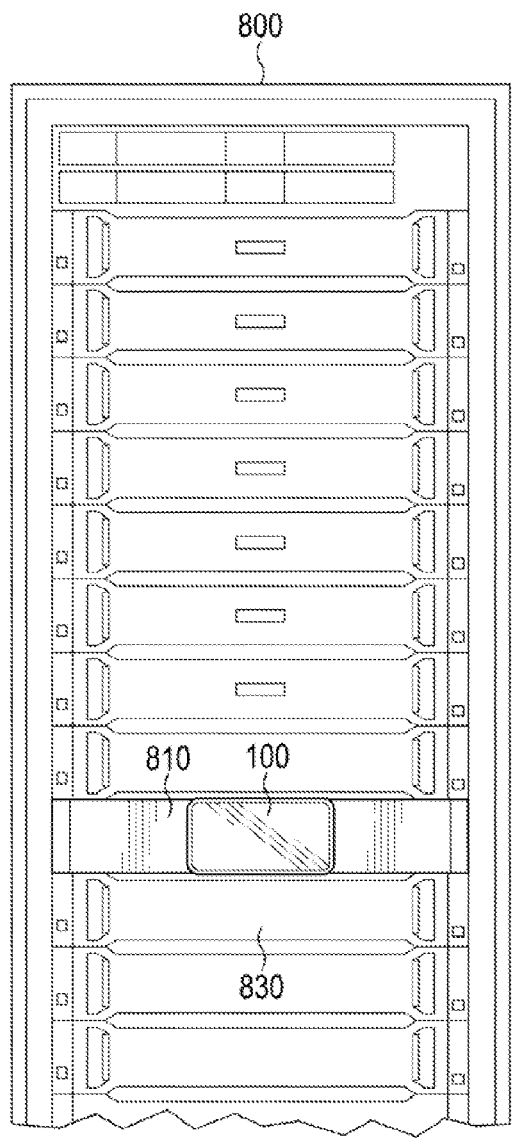
FIG. 8 is an isometric view of the device attached to a front of a rack, according to an example.

FIG. 8 is an isometric view of the device attached to a front of a rack, according to an example. Device 100 can be mounted to a rack 800. For example device 100 can be attached to a blank dock of rack 800 via a hinge at the cutout portion 130 located at the back side 120 of the device 100. The hinge enables the device 100 to rotate or flip up and down such that the device 100 can be move out of the way for easy access to other computing devices 830 mounted in the rack 800 (e.g., below the device 100). In the example of FIG. 8, the device 100 is mounted on a 2 rack unit (2U) blank dock 810 of the rack 800. In such a use case, for example, the device 100 can be communicatively coupled (wired or wirelessly) to the computing devices 830 mounted on the rack 800 to monitor the devices.

Figure 9:
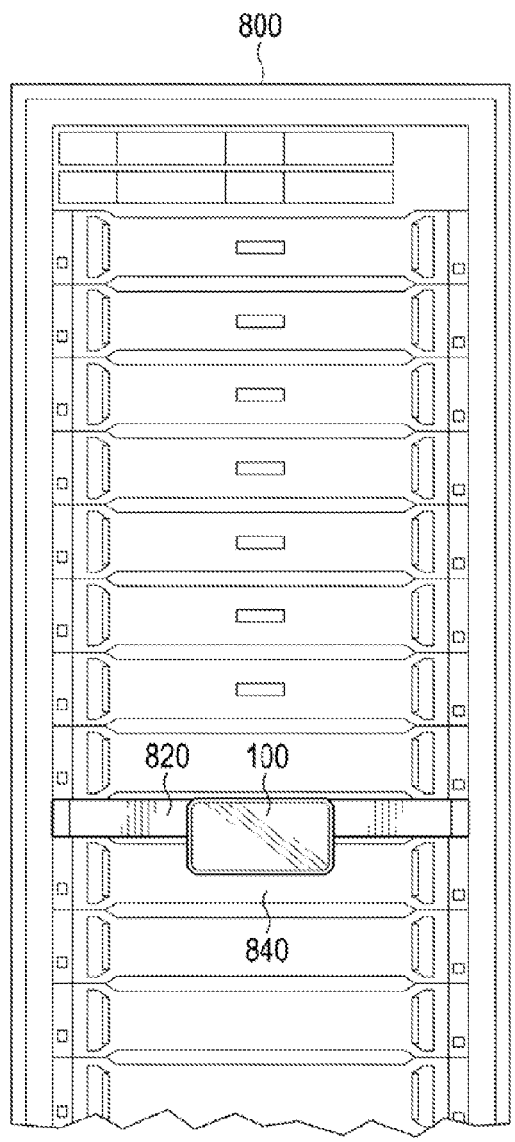
FIG. 9 is an isomeric view of the device attached to the front of the rack, according to another example.

FIG. 9 is an isometric view of the device attached to the front of the rack, according to another example. In the example of FIG. 9, device 100 is mounted to the rack 800 via a hinge. The hinge enables the device 100 to flip up and down such that the device can be moved out of the way to access other computing devices 840 mounted on the rack 800. In this example, the device 100 is mounted on a 1U blank dock 820 of the rack 800. It should be noted that in other examples, device 100 can be mounted to any rack unit (e.g., 3U, 4U, etc.) space in the rack 800.

Figure 10:
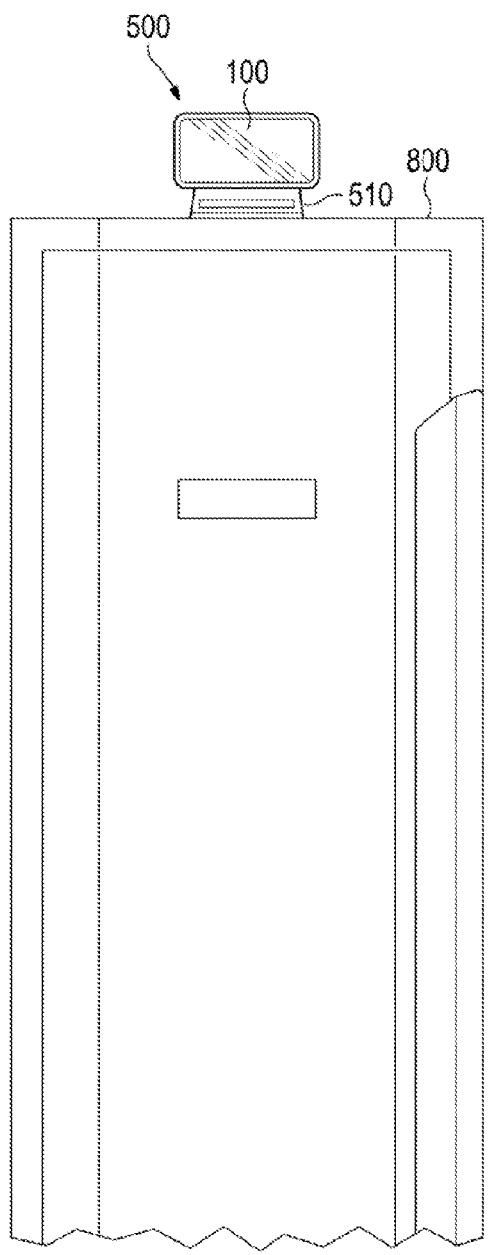
FIG. 10 is an isometric view of the device mounted on top of the rack, according to an example.

FIG. 10 is an isometric view of the device mounted on top of the rack, according to an example. The system 500 including the device 100 and the stand 510 can be mounted on the top of the rack 800, as shown in FIG. 10. Magnetic members 516 disposed within the base portion of the stand 510 enable the system 500 to stand firmly on the top of the rack 800. Further, the device 100 can be rotated (or flipped) about the hinge as needed, to provide a viewing angle for a user. For example, the device 100 can be flipped downwards such that the display region 112 of the device 100 can be seen clearly.

Figure 11:
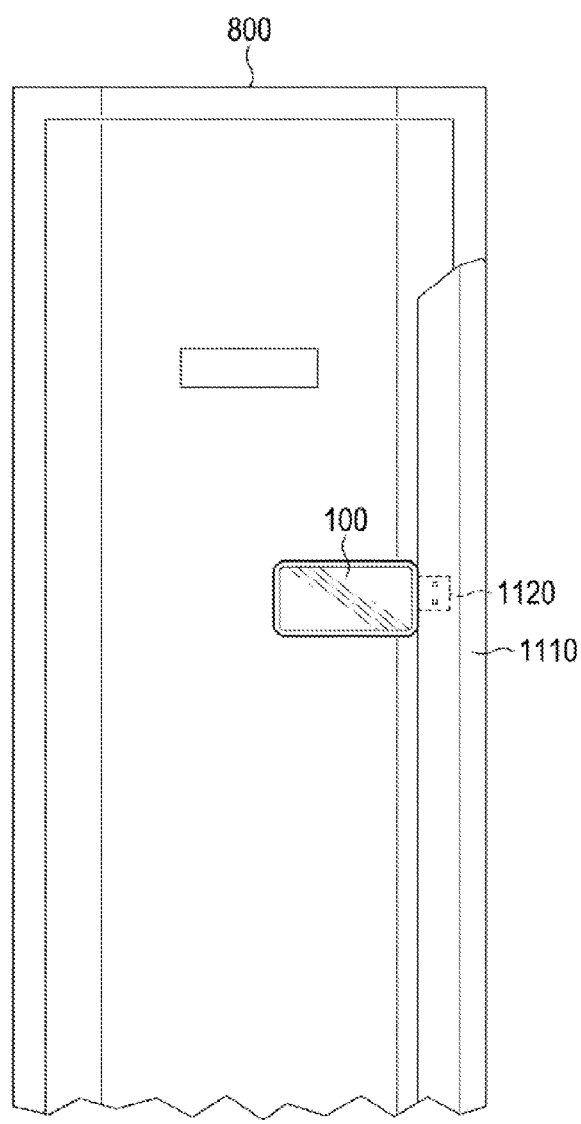
FIG. 11 is an isometric view of the device mounted to a door of the rack, according to an example.

FIG. 11 is an isometric view of the device mounted to a door of the rack, according to an example. Device 100 can be mounted to the door 1110 of the rack 800 via a bracket 1120. Bracket 1120 can be attached to the cavity region 140 on the back side 120 of the device 100. Bracket 1120 can then be attached to the door 1110 of the rack 800, thereby providing another option for mounting the device 100 to the rack 800.

Figure 12:
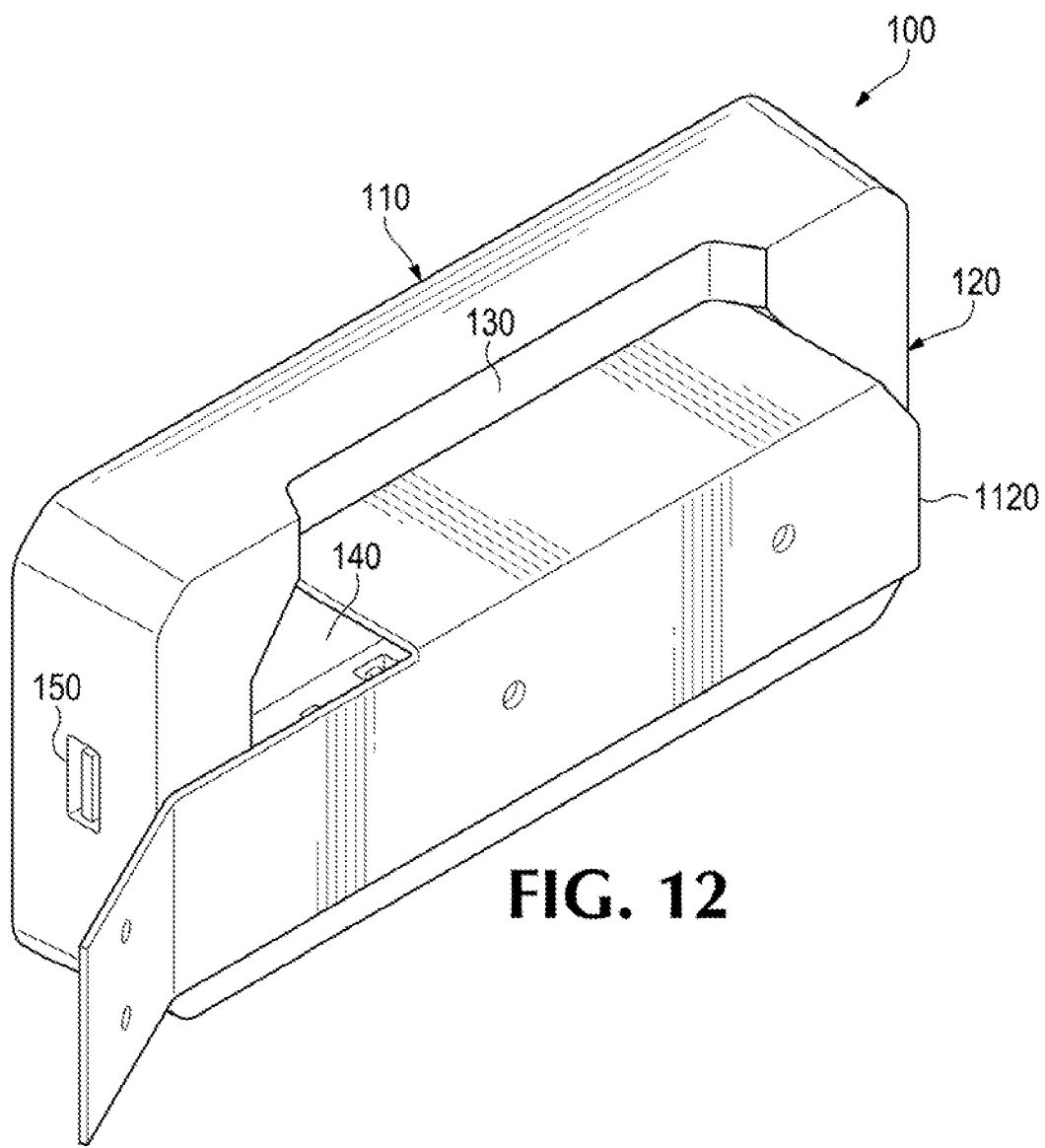
FIG. 12 is an isometric view of the device with a mounting bracket attached to the cavity region of the device, according to an example.

FIG. 12 is an isometric view of the device with a mounting bracket attached to the cavity region of the device, according to an example. The example of FIG. 12 shows the mounting bracket 1120 attached to the cavity region 140 on the back side 120 of the device 100. Accordingly, the device 100 can be attached to the door 1110 of the rack. In this mounting option, for example, the device 100 can be attached behind a handle of the door 1110 of the rack 800. Cables 420 from the back side 120 of the device 100 can be routed through the bracket and around the interior door edge.

In the foregoing description, numerous details are set forth to provide an understanding of the present disclosure. However, it will be understood by those skilled in the art that the present disclosure may be practiced without these details. While the present disclosure has been disclosed with respect to a limited number of examples, those skilled in the art will appreciate numerous modifications and variations therefrom. It is intended that the appended claims cover such modifications and variations as fall within the true spirit and scope of the present disclosure.

What is claimed is:

1. A device, comprising:
    a first side comprising a display region;
    a second side comprising a cavity region to house a port; and
    a third side comprising a cutout region adjacent to the cavity region,
    wherein the cavity region is to house a plurality of ports comprising at least one of a communication port, a storage portion, a data port, or a power port.

2. The device of claim 1, wherein the cutout region is to removably attach the device to a stand via a hinge, and wherein the device is rotatable about the hinge.

3. The device of claim 1, wherein the cutout region is to route cable from the cavity region out of the device.

4. The device of claim 1, wherein the cutout region is a portion of the third side.

5. The device of claim 1, wherein the cavity region is to receive a removably attachable bracket to mount the device to a rack.

6. The device of claim 1, wherein the display region comprises a capacitive touchscreen, and wherein the display region is to display data comprising information icons and touch control icons.

7. The device of claim 1, comprising a plurality of sides including the first side, the second side, the third side, a fourth side, a fifth side, and a sixth side,
    wherein the first side is a front side of the device,
    wherein the second side is a back side of the device, opposite the first side, and
    wherein the third, fourth, fifth, and sixth side form sidewalls of the device.

8. The device of claim 7, wherein at least one sidewall includes a second port.

9. The device of claim 7, comprising a security lock removably attachable to at least the back side or a sidewall of the device.

10. A device, comprising:
    a first side comprising a display region;
    a second side comprising a cavity region to house a port;
    a third side comprising a cutout region adjacent to the cavity region; and
    a removable case for enclosing a perimeter of the device.

11. A system, comprising:
    a device, comprising:
        a front side including a display area; and
        a back side, comprising:
            a cavity region to house a plurality of ports; and
            a cutout portion at an edge of the back side; and
    a stand, comprising:
        a top portion comprising a hinge to removably attach to the device; and
        a base portion comprising a cutout region to egress cable from the device.

12. The system of claim 11, comprising magnetic members within the base portion of the stand to mount the system on top of a rack.

13. The system of claim 11, comprising a hinge within the cutout portion of the device to mount the device in a rack, wherein the device is rotatable about the hinge.

14. The system of claim 11, comprising a bracket removably attachable to the cavity region of the device to mount the device to a door of a rack.

15. The system of claim 11, comprising a removable shell for enclosing sidewalls of the device.

16. The system of claim 15, comprising at least one port on a sidewall of the device.

17. The system of claim 16, wherein the plurality of ports and the at least one port include at least one of a communication port, a storage port, a data port, or a power port.

18. The system of claim 11, wherein the display area includes a capacitive touchscreen to receive user input and to display data.

\* \* \* \* \*